(12) United States Patent  
Tůma et al.

(10) Patent No.: US 8,829,470 B2  
(45) Date of Patent: Sep. 9, 2014

(54) CONFIGURABLE CHARGED-PARTICLE APPARATUS

(71) Applicant: FEI Company, Hillsboro, OR (US)

(72) Inventors: Lubomir Tůma, Brno (CZ); Josef Šesták, Břeclav (CZ)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 14/060,170

(22) Filed: Oct. 22, 2013

(65) Prior Publication Data

US 2014/0110597 A1    Apr. 24, 2014

Related U.S. Application Data

(60) Provisional application No. 61/716,680, filed on Oct. 22, 2012.

(30) Foreign Application Priority Data

Oct. 22, 2012    (EP) ..................................... 12189372

(51) Int. Cl.  
*G21K 5/08* (2006.01)  
*H01J 37/26* (2006.01)  
*H01J 37/141* (2006.01)  
*H01J 37/20* (2006.01)

(52) U.S. Cl.  
CPC ........... *G21K 5/08* (2013.01); *H01J 2237/1415* (2013.01); *H01J 37/265* (2013.01); *H01J 37/1413* (2013.01); *H01J 2237/1035* (2013.01); *H01J 37/20* (2013.01); *H01J 2237/2813* (2013.01); *H01J 2237/2802* (2013.01)  
USPC ...... 250/442.11; 250/306; 250/310; 250/311; 250/440.11; 250/441.11

(58) Field of Classification Search  
USPC ................... 250/306, 307, 310, 311, 440.11, 250/441.11, 442.11  
See application file for complete search history.

(56) References Cited

U.S. PATENT DOCUMENTS 5,270,552 A    12/1993    Ohnishi et al.  
6,307,312 B1 *    10/2001    Tanaka .......................... 313/412  
(Continued)

FOREIGN PATENT DOCUMENTS

| GB | 2161019 | 1/1986 |
| JP | 56154758 | 11/1981 |
| JP | 01197951 | 8/1989 |

OTHER PUBLICATIONS

Humphry, M.J., et al., 'Ptychographic electron microscopy using high-angle dark-field scattering for sub-nanometre resolution imaging,' Nature Communications, Mar. 6, 2012, 7 pages.

*Primary Examiner* — Michael Logie  
(74) *Attorney, Agent, or Firm* — Scheinberg & Associates, P.C.; Michael O. Scheinberg

(57) ABSTRACT

The invention relates to a charged-particle apparatus having
- a charged particle source with an optical axis;
- a magnetic immersion lens comprising a first lens pole and a configurable magnetic circuit; and
- a first sample stage movable with respect to the optical axis.

The apparatus has a first configuration to position the sample, mounted on the first stage, with respect to the optical axis and a second configuration, having a second lens pole mounted on the first stage and intersecting the optical axis, equipped with a second sample stage to position the sample between the two lens poles and is movable with respect to the optical axis, causing the optical properties of the magnetic immersion lens to differ in the two configurations, and can, in the second configuration, be changed by positioning the second lens pole using the first stage, thus changing the magnetic circuit.

20 Claims, 2 Drawing Sheets

(56) References Cited

U.S. PATENT DOCUMENTS

| | | | |
|---|---|---|---|
| 6,906,335 B2* | 6/2005 | Khursheed | 250/442.11 |
| 8,183,547 B2 | 5/2012 | Miller | |
| 2004/0079884 A1* | 4/2004 | Khursheed et al. | 250/311 |
| 2010/0108881 A1* | 5/2010 | Toth et al. | 250/307 |
| 2011/0297827 A1* | 12/2011 | Asai et al. | 250/310 |
| 2012/0257720 A1* | 10/2012 | Anan et al. | 378/64 |

* cited by examiner

CONFIGURABLE CHARGED-PARTICLE APPARATUS

This Application claims priority from U.S. Prov. Appl. No. 61/716,680, filed Oct. 22, 2012, where is hereby incorporated by reference.

The invention relates to a configurable charged-particle apparatus equipped with:
- a charged particle column comprising
  - a charged particle source for producing a beam of charged particles along an optical axis; and
  - a magnetic immersion lens for focusing the beam of charged particles on a sample position, the magnetic immersion lens comprising a first lens pole, said first lens pole forming the part of the magnetic immersion lens furthest removed from the charged particle source;
- an excitation coil surrounding the first lens pole;
- at least a first stage on which a sample can be mounted, the first stage movable with respect to the optical axis; and
- one or more detectors for detecting radiation emanating from the sample in response to the beam of charged particles stimulating the sample;

the immersion lens having a configurable magnetic circuit.

Such a charged-particle microscope is known from UK patent application GB2161019A. The known application describes a Scanning Electron Microscope (SEM) with an electron source producing a beam of electrons, and an objective lens comprising two lens poles and an excitation coil focusing the beam of electrons on a sample position located in an evacuable sample chamber. The lens pole farthest removed from the electron source is a removable and exchangeable lens pole, so that a specific lens pole can be mounted to make the SEM better suited for a specific task. As an example the SEM can be turned in a SEM with an immersion lens, a SEM with a lens allowing large tilt angles for a sample close to the lens, etc. The known microscope is thus configurable by mechanically mounting a lens pole to the microscope column, more specifically by mounting the lens pole to a part of the objective lens that is an integral part of the microscope column.

A disadvantage of this microscope is that changing a lens pole involves dismounting a lens pole and mounting another lens pole in the sample chamber, said sample chamber often being cramped in space, cluttered with detectors, and also necessarily clean due to vacuum demands.

As a result the time involved with a change is rather long, and the risk of contamination (dust and/or grease accidentally applied to parts in the sample chamber) is large.

Another disadvantage is that changing the configuration involves venting the sample chamber, and pumping down. When, for example, using a cryogenic inspection of the sample this leads to extremely long time before the apparatus can be used again. This makes this type of SEM unsuited for, for example, inspecting a sample at cryogenic temperatures.

Another disadvantage is that the lens pole should be well centered with respect to the part it must be attached: the part of the objective lens that is an integral part of the microscope column. This may not always be possible with the required accuracy, especially not after several mounting/dismounting cycles, which may lead to slight damages, such as burrs.

A further disadvantage is that the changing does not lend itself for automation, but requires manual intervention.

Yet another disadvantage is that the number and position of the detectors, such as secondary electron detectors and back-scattered electron detectors, X-ray detectors, etc, is fixed, and thus limited by the different lens poles that can be used.

The invention intends to provide a solution for the above given disadvantages.

To that end the apparatus according to the invention is characterized in that the apparatus has at least a first configuration and a second configuration, the apparatus in the first configuration equipped to position the sample with respect to the optical axis while the sample is mounted on the first stage, the apparatus in the second configuration having a second lens pole mounted on the first stage, the second lens pole intersecting the optical axis, and the apparatus in the second configuration equipped with a second stage for mounting the sample thereon, the second stage equipped to position the sample between the first lens pole and the second lens pole, the second stage movable with respect to the optical axis, as a result of which the optical properties of the magnetic lens differs in the first and the second configuration, and can in the second configuration be changed by positioning the second lens pole using the first stage, thus changing the magnetic circuit.

By mounting the second lens pole on a stage, the second lens pole can be aligned (with respect to the first lens pole), thus eliminating the alignment problems described above.

As the second lens pole is positioned on the stage, and not on a part of the column, the second lens pole can be mounted on the stage while the stage is in a position enabling easy mounting of the second pole piece on the stage and then having the stage positioning the second pole piece on the optical axis.

It is noted that in the first configuration the sample can be mounted on the first stage, but—if in this configuration the second stage is available as well, as will often be the case—the sample can also be mounted on the second stage. When the sample is mounted on the first stage the second stage should be removed completely or, for example, be retracted sufficiently to offer sufficient space.

Preferably the apparatus is in both the first and the second configuration equipped with two stages, although not both stages need to be used in both configurations.

In an embodiment the second lens pole has a central bore and a detector is positioned below the bore, the bore for passing electrons that passed through a sample mounted at the sample position, the particle-optical apparatus thus capable of operating as a STEM.

The electrons, after having passed the sample, pass through the bore to be intercepted by the detector.

The detector may, for example, be a High Angle Annular Dark Field detector (HAADF detector), an Annular Dark Field Detector (ADF detector), a Bright Field Detector (BDF), or the like.

The detector may also be a pixilated detector, such as a CMOS detector for detecting an image. This enables so-called ptychographic imaging, as described in "Ptychographic electron microscopy using high-angle dark-field scattering for sub-nanometer resolution imaging", M. J. Humphry et al., Nature Communications, Mar. 6, 2012, DOI: 101038/ncomms1733, further referred to as Humphry [-1-].

In a preferred embodiment the detector is mounted on the second lens pole, as a result of which the mutual position of the second lens pole and detector is assured.

Although the before mentioned detector for detecting electrons passing through the sample may be mounted on the stage, (or under the stage, where the stage shows a hole as well), in this embodiment the detector is exchanged together with the second lens pole. Electric connections can be made with a suited connector inside the sample chamber.

In yet another embodiment a lens is mounted between the second lens pole and the STEM detector, as a result of which the magnification between sample plane and detector plane is changed, more specifically the angular magnification.

By changing the angular magnification the demands on, for example, the angular resolution of a HAADF detector are eased.

In another embodiment in the second configuration the second lens pole can be translated in three orthogonal directions.

When defining the x-y plane as the plane perpendicular to the optical axis, then a movement of the second lens pole in this plane is used to align the second lens pole and/or detectors mounted to the second lens pole.

It is noted that, as typically the first stage is capable of moving an object (sample, second lens pole) in a plane perpendicular to the optical axis (referred to as the x-y plane) and along the optical axis (referred to as the z-axis), the second lens pole can be positioned along the z-axis by the first stage.

Often the first stage is also capable to tilt in two directions and rotation, thus enabling to position the second lens pole with 5 or 6 degrees of freedom (DoFs).

In a further embodiment the second configuration shows several sub-configurations, differing in the distance of the first lens pole to the second lens pole, the change in sub-configurations realized by moving the first stage along the optical axis.

By changing the gap between first and second lens pole, the magnetic circuit of the immersion lens is changed. As typically the first stage is capable of moving an object (sample, second lens pole) in a plane perpendicular to the optical axis (referred to as the x-y plane) and along the optical axis (referred to as the z-axis), the second lens pole can be positioned along the z-axis by the first stage.

It is noted that the different sub-configurations can have a benefit in terms of lens behavior, or in physical space between the first and second lens poles (the gap between the lens poles), needed for, for example, a tilt of the sample.

It is further noted that the change between sub-configurations is done by controlling the first stage, and thus is done without breaking vacuum or even dismounting the sample from the second stage.

It is mentioned that another sub-configuration may necessitate another position of the second stage along the z-axis.

In yet another embodiment in the first configuration the second lens pole is parked in a stationary position in the sample chamber.

In this embodiment the vacuum of the vacuum chamber need not be compromised for changing the configuration. It is then very well possible to maintain, for example, a cryogenic temperature at one or more positions of the sample chamber and/or stages. Also changing from the first to the second configuration can be done without venting the system, thus shortening the time needed to change.

In yet another embodiment the second lens pole is in the first configuration mounted on a part of the first stage that in the first configuration is removed from the optical axis, so that the second lens pole does not form part of the magnetic circuit of the immersion lens.

In this embodiment the first stage is capable to move the second lens pole in the first configuration from a position removed from the optical axis (where it is not part of the magnetic circuit) to a position in the second configuration where it is on the optical axis and where it is part of the magnetic circuit. In the first configuration a sample can be mounted on the first stage, or as an alternative, on the second stage.

In yet another embodiment the configurable charged-particle apparatus is equipped with a controller programmed to change the lens configuration form the first configuration to the second configuration.

In this embodiment the apparatus can automatically change its lens configuration, without human intervention. This enables, for example, remote control and automated inspection in different configurations. Especially in combination with an automatic loader for loading samples from, for example, a cassette with samples, to the first or second stage, a complete automated workstation is created, capable of performing remotely controlled inspection of samples, or automatic studies of large series of samples, as occurs in biological studies and mineralogy.

In yet another embodiment the configurable charged-particle apparatus comprises an ion column with an ion source for machining a sample, an electron column with an electron source for imaging a sample, and a manipulator for positioning a sample attached to said manipulator, the electron column equipped with the magnetic immersion lens, the ion column producing an ion beam and the electron column producing an electron beam, the ion beam and the electron beam in the first configuration intercepting each other.

In this embodiment the apparatus resembles in the first configuration an apparatus with an ion beam and an intersecting electron beam, such as the DualBeam™ microscope as manufactured by FEI Company, Hillsboro, USA In yet another embodiment the configurable charged-particle apparatus is equipped with an automatic loader for loading samples from a sample cassette to the first and/or second stage.

An automatic loader enables batch processing of samples, such as biological samples or semiconductor samples. The biological samples may be coupes of a tissue, such as rat brains, either treated to be inspected at room temperature, or the samples may be at a cryogenic temperature.

In yet another embodiment the configurable charged-particle apparatus is equipped with an automatic loader for loading lens poles from a lens pole cassette to the first stage.

Using an automatic loader, several pole pieces can be available in the loader and automatically exchanged so that the apparatus can pick the correct pole piece to accommodate a certain configuration, which may then be defined as the second pole piece.

In an aspect of the invention a method of using a configurable charged-particle apparatus according to the invention, the apparatus equipped with an ion column for machining a sample; an electron column for imaging a sample, and a manipulator for attaching a sample thereto and positioning the sample, the method comprising the steps of repeatedly:
  Loading a sample into the apparatus onto the first stage;
  Extracting a lamella from the sample using the ion column;
  Attach the lamella to the manipulator;
  Thin the lamella;
  Position the lamella for imaging with the electron column;
  Image at least part of the lamella;
is characterized in that the method further comprises the steps of:
  Before loading the sample into the apparatus onto the first stage, the apparatus is brought in the first configuration;
  After attaching the lamella to the manipulator the sample is removed from the first stage and the apparatus is brought in the second configuration; and
  Positioning the lamella for imaging involves position the lamella between the first and the second lens pole.

The above describes a workflow in which a lamella is taken from a sample, such as a semiconductor wafer. It is known to excise a lamella from a sample with an ion beam, see for example U.S. Pat. No. 5,270,552, describing a so-called lift-out technique. In the lift-out technique an ion beam is directed to a sample and a trench is cut with the ion beam around a lamella to be removed from the sample, in such a way that the lamella is not or hardly connected at its base. Just before freeing said lamella from the sample the lamella is attached to a needle-like protrusion of a manipulator. The attaching is, for example done used Ion Beam Induced Deposition. The lamella is then thinned to a thickness of, for example, between 20 nm and 50 nm, and attached to a sample holder. The manipulator is then cut free from the lamella, and the sample holder is then brought in the inspection range of an electron column, after which the lamella is imaged.

By loading the sample while the apparatus is in the first configuration, the lamella can be obtained in the manner known from U.S. Pat. No. 5,270,552 and as routinely performed in DualBeam™ apparatuses. The apparatus can then be changed to the second configuration for high-resolution Scanning Transmission Electron Microscopy (STEM).

It is noted that some steps may be performed in another order than shown above: for example attaching the manipulator to the lamella may be done before the lamella is completely freed, but also after freeing it completely.

In a further embodiment of the method the lamella is attached to the second stage and detached from the manipulator before imaging.

Although the lamella can be positioned to the imaging position while attached to the positioned, the positioned is typically not equipped to position the lamella with the positional accuracy and/or resolution needed for imaging. Therefore the lamella is best attached to the second stage and detached from the positioned before imaging.

In another embodiment of the method the loading involves loading with an automated loader a sample from a cassette with samples.

An automatic loader enables batch processing of samples, such as biological samples or semiconductor samples. The biological samples may for example be coupes of a tissue, such as rat brains, either treated to be inspected at room temperature, or the samples may be at a cryogenic temperature.

The invention will now be elucidated in more detail on the basis of exemplary embodiments and the accompanying schematic drawings, where identical numerals refer to corresponding features. To that end:

Figure 1:
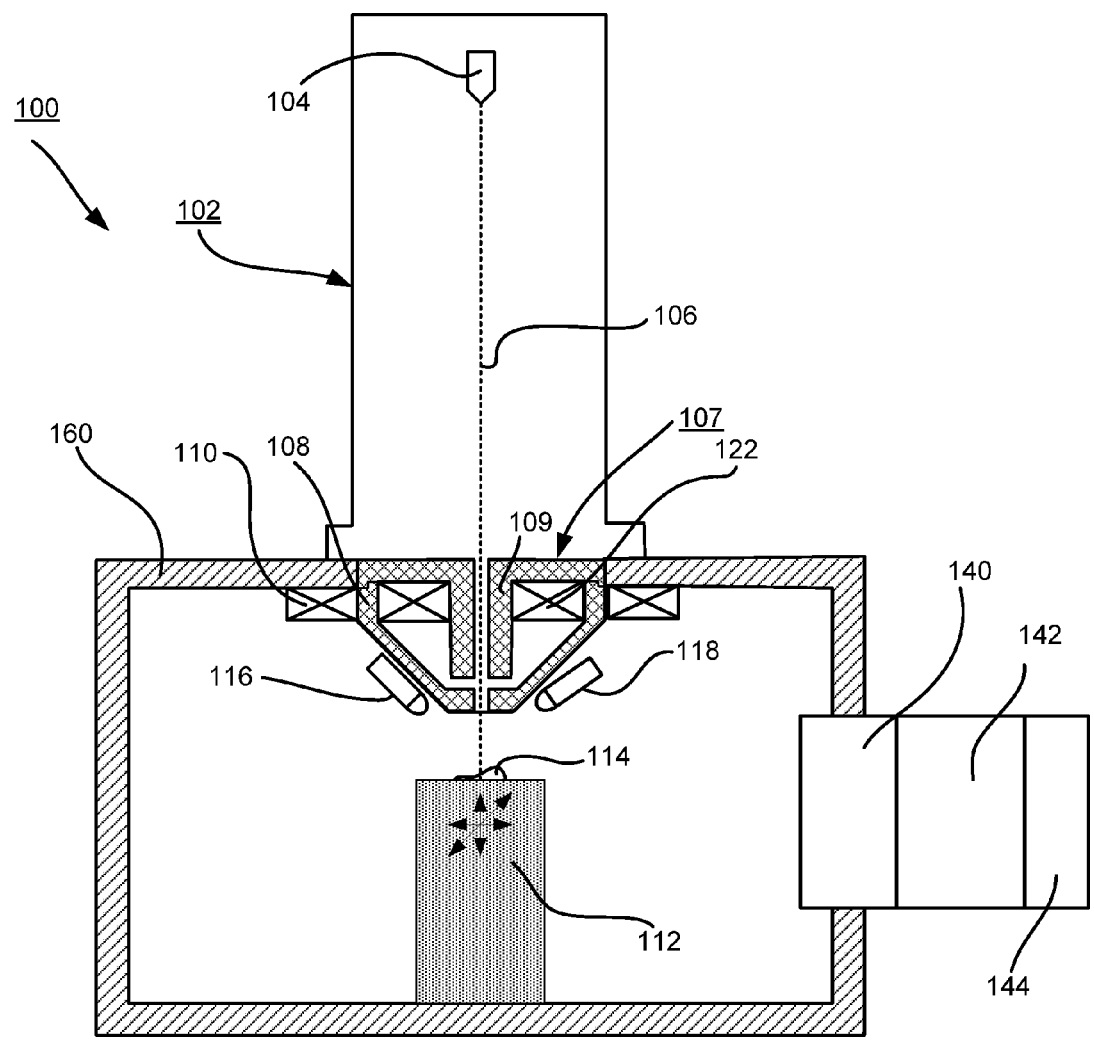
FIG. 1 shows an apparatus in the first configuration.

FIG. 1 schematically shows an apparatus in the first configuration.

The apparatus 100 shows an evacuable sample chamber 160, equipped with a stage 112 for positioning a sample 114. The sample is introduced through a load lock 140, preferably by an autoloader 142 for automatic loading of samples from a sample cassette 144 attached to it. The sample chamber is evacuated by vacuum means (not shown), preferably a pump such as a turbo-molecular pump.

On the sample chamber a column 102 is mounted comprising an electron source 104 producing an electron beam along the optical axis 106, the electron beam having a selectable energy of typically between 200 eV and 30 keV, although lower and higher energies are known to be used. The column is equipped with an objective lens 107 with an excitation coil 110 surrounding the first lens pole 108 for generating a focusing magnetic field in the gap between the first lens pole and the sample.

It is noted that the objective lens may comprise another lens pole 109 and another excitation coil 122 to focus the electron beam in whole or in part.

The electron beam irradiates the sample 114, as a result of which radiation emanating from the sample. Detectors 116, 118 detect the radiation, the two detectors either detecting different kinds of radiation (secondary electrons (typically having an energy below 50 eV), backscattered electrons (typically having an energy above 50 eV), X-rays, or light) or similar radiation having an angular distribution.

It is noted that the column further comprises apertures, deflectors, and lenses to manipulate the beam and scan the beam over the sample. The apparatus may comprise from one to six or even more detectors. Augmenting the automated loader a manual lock may be included, for example a door that can be opened, although this may require venting of the chamber each time the sample is changed via this manual lock. The displacement of the stage 112 is typically several centimeters, and stages with a travel range of more than 150 mm*150 mm perpendicular to the optical axis and 10 mm parallel to the optical axis, and that may include tilt capabilities, are known. It is known that stages with such large displacements may comprise more than one sample position to hold several samples.

Figure 2:
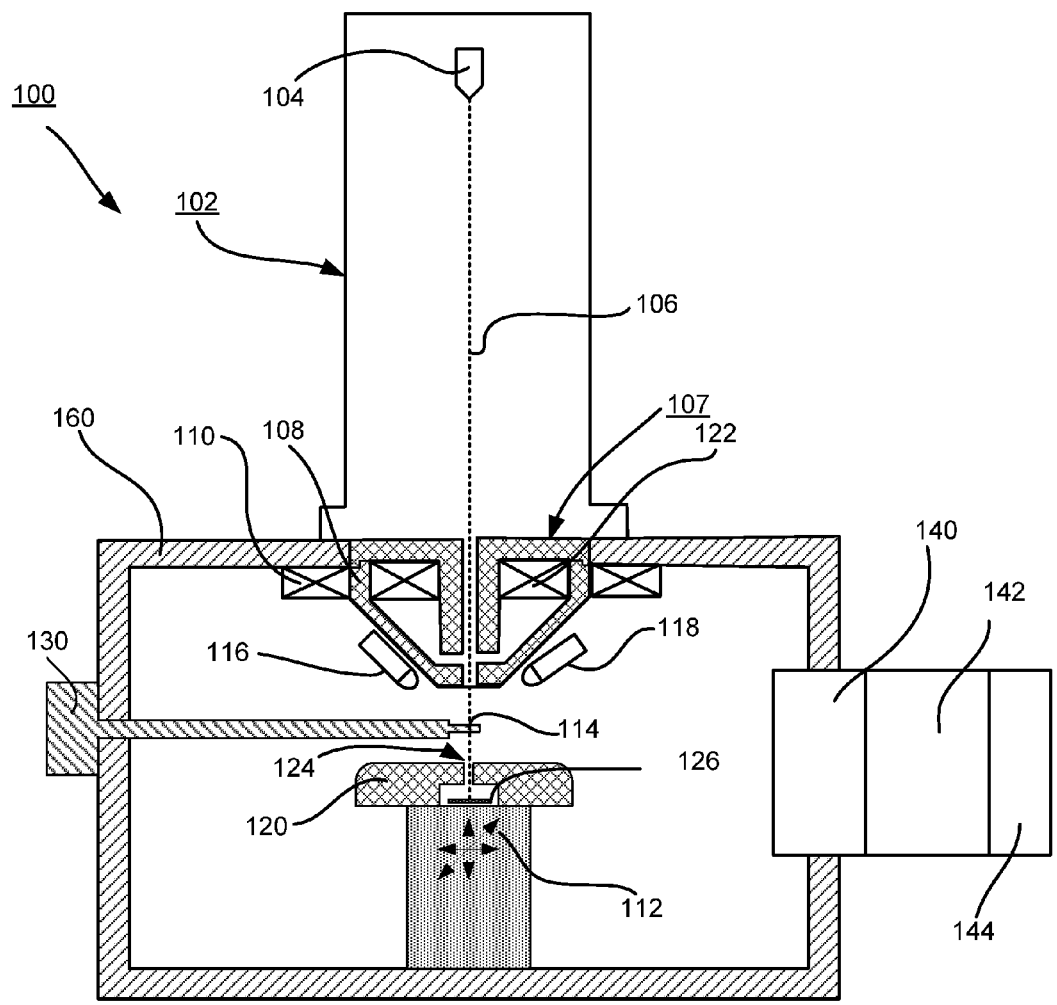
FIG. 2 shows said apparatus in the second configuration.

FIG. 2 schematically shows the apparatus in the second configuration.

FIG. 2 can be thought to be derived from FIG. 1. Instead of a sample the stage 112 now carries (holds, positions) a second lens pole 120. The sample is now held (positioned, carried) by a second stage 130, preferably a stage as used in a Transmission Electron Microscope (TEM). Such stages are known to be suited for ultra-high resolution.

The second lens pole preferably has a central hole 124 and a detector 126 mounted below the hole. For best alignment this detector is secured to the second lens pole. As the second lens pole must be well aligned for good optical behavior of the immersion lens, the detector is then also well aligned Assuming that the sample is sufficiently thin (for semiconductor materials typically below 100 nm, preferably below 50 nm; for biological materials typically below 500 nm, preferably below 100 nm) a part of the electrons that impinge on the sample will travel through the sample. Part of the electrons are scattered over an angle. The amount of electrons absorbed by the sample, and the angular distribution of the scatter angle of the transmitted electrons gives information of the sample. This information can be detected by detector 126.

Alternatively a diffraction pattern is formed on the detector, the detector a pixilated detector. This enables ptychographic reconstruction of the sample as described by Humphry [-1-]

The strength of the magnetic immersion lens is normally varied by varying the electrical current through the excitation coil. In the second configuration the immersion lens strength and other parameters, such as lens aberrations, can be additionally varied by varying the distance between the first and the second lens pole. As known to the person skilled in the art a lens with a smaller gap will, at given excitation, display a smaller focal length and axial aberrations (chromatic and spherical), leading to—using the same probe current and beam energy—a smaller probe size. Preliminary results showed that the second configuration enabled reduction of the probe size to half the diameter compared to the first configuration.

A magnifying (preferably magnetic) lens [not shown] may be placed between the hole in the second lens pole and the detector to change the (angular or linear) magnification between sample plane and detector plane. Such a lens may comprise excitation coils, or permanent magnetic material to generate the magnetic field.

It is noted that, when the apparatus is in the first configuration, the second lens pole should not be part of the magnetic circuit of the immersion lens. The second lens pole may be stored outside the sample chamber, or inside a "parking bay" in the sample chamber. If parked outside the sample chamber, this may be done by opening the sample chamber and manually exchanging the lens pole, or by having a load lock for lens poles (that may also serve to load samples).

Alternatively the lens pole is parked on the stage, far removed from the sample position. "Far" is here defined as so far that the magnetic field of the immersion lens is not changed to an extend that the image of the sample is deformed, displaced, etc.

Preferably the apparatus is equipped with a controller that controls the stage etc. in such a way that the change from a fist to a second configuration is done automatically.

It is noted that the apparatus may further be equipped with an ion column, producing an ion beam for machining a sample, Gas Injection Systems (GIS) to inject gases into the sample chamber for Ion Beam Induced Deposition (IBID), a manipulator (also known as "needle") to which a sample may be attached by IBID, one or more detectors, one or more load locks, etc. All this is well-known to the skilled person, and is commercially available.

It is further noted that the second stage may be present in the first configuration. A sample may then be mounted on this stage, while the first stage is left unused, of it may be moved out of the way.

It is mentioned that, although the embodiments discuss the use of a magnetic immersion lens for focusing an electron beam, the use of a magnetic immersion lens for focusing an ion beam is not excluded.

In another embodiment a retractable pole piece (counter pole) is split into two parts.

A counter pole piece (a pole piece on the side of the sample removed from the charged-particle column comprising the charged particle source) allows significant STEM (Scanning Transmission Electron Microscope) mode resolution improvement in SEM (Scanning Electron Microscope) and DB (Dual Beam, comprising both an electron beam column and an ion beam column) instruments with an immersion final lens. To keep both function of a system with the counter pole (SEM and high resolution STEM), the counter pole must be retractable. The retractable pole piece design must fulfill several contradictory requirements: long retraction distance, high precision and reproducibility of placement, large size, high stability, exposure to large magnetic forces, etc. This invention solves these requirements by splitting the counter pole into two parts with two different functions: a small part defining the optical properties (precision, stability, reproducibility) and a large part creating the magnetic circuit (size, retractable distance, stiffness).

Therefore in a first configuration a sample is mounted on a first stage at a sample position, and in a second mode a sample is mounted on a second stage. A precisely manufactured smaller part is permanently attached to the first stage far from the sample position of said first stage, so that it does not influence magnetic field of the immersion lens too much and that the magnetic immersion lens can be used without limitations close to the center of the first stage. A large part of the counter pole is retractably place on a third stage in the form of a retractable arm still further removed from the charged particle source. When switching to the second configuration (the HR STEM mode) the first stage brings and accurately places the smaller part under the immersion final lens and the second stage (the retractable mechanism) inserts the larger part close to the smaller part, so that there is just a small gap creating good magnetic connection. At this configuration the centering precision of the larger part is not critical and a simple retractable mechanism may be used. At the same moment the requirements (such as maximum stroke, load by counter pole mass and magnetic forces) for the sample stage are not so demanding.

The system can also consist of one larger part and one or several smaller parts. Selection of one of several smaller parts can help to configure optical properties of the system as for example a gap.

It is noted that, in all of the above embodiments, changing between the first configuration and the second configuration, typically necessitates positioning parts with the help of a stage under control of a controller. Inserting the sample may be accomplished by inserting a sample holder as used in a TEM in a so-named side entry sample positioned (the side-entry sample positioned positioning the sample holder), or it may be accomplished by e.g. inserting a sample via a load lock. In both these cases a controller controls access to the evacuated sample chamber. Hereby the changing in configuration can, in whole or in part, be automated.

It is further noted that preferably the second lens pole in the second configuration is energized by the immersion lens, i.e. part of the magnetic path of the immersion lens, and need not be energized by a separate magnetic field, for example caused by an auxiliary magnetic coil or permanent magnetic material, while in the first configuration the second lens pole is not part of the magnetic path of the immersion lens, i.e. does not notably effect the field of the immersion lens.

Non-Patent Literature.

[-1-] "Ptychographic electron microscopy using high-angle dark-field scattering for sub-nanometer resolution imaging", M. J. Humphry et al., Nature Communications, Mar. 6, 2012, DOI:101038/ncomms1733.

We claim as follows:

1. A configurable charged-particle apparatus equipped with:
    a charged particle column comprising:
        a charged particle source for producing a beam of charged particles along an optical axis; and
        a magnetic immersion lens for focusing the beam of charged particles on a sample position, the magnetic immersion lens comprising a first lens pole, said first lens pole forming the part of the magnetic immersion lens farthest from the charged particle source;
    an excitation coil surrounding the first lens pole;
    at least a first stage on which a sample can be mounted, the first stage movable with respect to the optical axis; and
    one or more detectors for detecting radiation emanating from the sample in response to the beam of charged particles stimulating the sample;
    the immersion lens having a configurable magnetic circuit;
    wherein:
    the apparatus has at least a first configuration and a second configuration, the apparatus in the first configuration equipped to position the sample with respect to the optical axis while the sample is mounted on the first stage, the apparatus in the second configuration having a second lens pole mounted on the first stage, the second lens pole intersecting the optical axis, and the apparatus in the second configuration equipped with a second stage for mounting the sample thereon, the second stage equipped to position the sample between the first lens pole and the second lens pole, the second stage movable with respect to the optical axis, as a result of which the optical properties of the magnetic immersion lens differs in the first and the second configuration, and can in the second configuration be changed by positioning the second lens pole using the first stage, thus changing the magnetic circuit.

2. The configurable charged-particle apparatus of claim 1 in which the charged particle source is an electron source; the second lens pole has a central bore; and in the second configuration a detector for detecting electrons that passed through the sample is positioned below the bore, the bore for passing electrons that passed through the sample, the particle-optical apparatus thus capable of operating as a Scanning Transmission Electron Microscope.

3. The configurable charged-particle apparatus of claim 2 in which a lens is mounted between the second lens pole and the detector for detecting electrons that passed through the sample, as a result of which the magnification between sample plane and detector plane is changed, more specifically the angular magnification.

4. The configurable charged-particle apparatus of claim 1 in which the detector for detecting electrons that passed through the sample is mounted on the second lens pole.

5. The configurable charged-particle apparatus of claim 1 in which in the second configuration the second lens pole can be translated in three orthogonal directions with respect to the first lens pole.

6. The configurable charged-particle apparatus of claim 5 in which in the second configuration several sub-configurations are defined, the sub-configurations differing in the distance of the first lens pole to the second lens pole, the change in sub-configurations realized by a movement of the first stage along the optical axis.

7. The configurable charged-particle apparatus of claim 1 in which in the first configuration the second lens pole is parked in a stationary position in the sample chamber, the stationary position removed from the optical axis as a result of which the second lens pole, when parked in the stationary position, does not form part of the magnetic circuit of the magnetic immersion lens.

8. The configurable charged-particle apparatus of claim 1 in which in the first configuration the second lens pole is mounted on a part of the first stage that is removed from the optical axis, so that the second lens pole does not form part of the magnetic circuit of the magnetic immersion lens.

9. The configurable charged-particle apparatus of claim 1 in which the apparatus is equipped with a controller programmed to change the lens configuration from the first configuration to the second configuration.

10. The configurable charged-particle apparatus of claim 1 in which the apparatus comprises an ion column with an ion source for machining a sample, an electron column with an electron source for imaging a sample, and a manipulator for positioning a sample attached to said manipulator, the electron column equipped with the magnetic immersion lens, the ion column producing an ion beam and the electron column producing an electron beam, the ion beam and the electron beam in the first configuration intercepting each other.

11. A method of using the configurable charged-particle apparatus of claim 10, in which the apparatus is equipped with a manipulator for attaching and manipulating a lamella, the method comprising the steps of repeatedly:
loading a sample into the apparatus onto the first stage;
extracting a lamella from the sample using the ion beam;
attaching the lamella to the manipulator;
thinning the lamella;
positioning the lamella for imaging with the electron column;
imaging at least part of the lamella;
wherein:
before loading the sample into the apparatus onto the first stage, bringing the apparatus in the first configuration;
after attaching the lamella to the manipulator removing the sample from the first stage and bringing the apparatus in the second configuration,
positioning the lamella for imaging with the electron column involves positioning the lamella between the first and the second lens pole.

12. The method of claim 11 in which the lamella is attached to the second stage and detached from the manipulator before imaging.

13. The method of claim 11 in which the loading involves loading with an automated loader a sample from a cassette with samples.

14. The method of claim 11 in which the distance between the first lens pole and the second lens pole is varied in several sub-configurations of the second configuration, the change in sub-configurations realized by a movement of the first stage along the optical axis.

15. The method of claim 11 in which the apparatus is equipped with a controller programmed to change the lens configuration from the first configuration to the second configuration.

16. The method of claim 11 in which in the first configuration the second lens pole is mounted on a part of the first stage that is removed from the optical axis, so that the second lens pole does not form part of the magnetic circuit of the magnetic immersion lens.

17. The method of claim 11 in which in the first configuration the second lens pole is parked in a stationary position in the sample chamber, the stationary position removed from the optical axis as a result of the which the second lens pole, when parked in the stationary position, does not form part of the magnetic circuit of the magnetic immersion lens.

18. The method of claim 11 in which the second lens pole has a central bore; and in the second configuration, imaging the lamella comprises detecting electrons that passed through the sample by a detector positioned below the bore, the bore for passing electrons that passed through the sample.

19. The configurable charged-particle apparatus of claim 1 in which the apparatus is equipped with an automatic loader for loading samples from a sample cassette to the first stage and/or second stage.

20. The configurable charged-particle apparatus of claim 1 in which the apparatus is equipped with an automatic loader for loading lens poles from a lens pole cassette to the first stage.

* * * * *